United States Patent
Wu et al.

(10) Patent No.: US 8,811,567 B2
(45) Date of Patent: Aug. 19, 2014

(54) SHIFT REGISTER

(71) Applicant: AU Optronics Corp., Hsin-Chu (TW)

(72) Inventors: Chen-Yi Wu, Hsin-Chu (TW); Ta-Wen Liao, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 52 days.

(21) Appl. No.: 13/771,042

(22) Filed: Feb. 19, 2013

(65) Prior Publication Data

US 2014/0010341 A1    Jan. 9, 2014

(30) Foreign Application Priority Data

Jul. 5, 2012  (TW) .............................. 101124217 A

(51) Int. Cl.
*G11C 19/00*  (2006.01)
*G11C 19/28*  (2006.01)

(52) U.S. Cl.
CPC .............. *G11C 19/00* (2013.01); *G11C 19/28* (2013.01)
USPC ..................... 377/64; 377/69; 377/78; 377/79

(58) Field of Classification Search
None
See application file for complete search history.

(56) References Cited

U.S. PATENT DOCUMENTS

| | | | |
|---|---|---|---|
| 8,031,827 B2 | 10/2011 | Tsai | |
| 8,160,198 B2 * | 4/2012 | Tsai et al. | 377/79 |
| 8,351,563 B2 * | 1/2013 | Yang et al. | 377/64 |
| 8,396,183 B2 * | 3/2013 | Yang et al. | 377/64 |
| 8,515,000 B2 * | 8/2013 | Yang et al. | 377/64 |
| 8,552,961 B2 * | 10/2013 | Yang et al. | 345/100 |
| 8,633,888 B2 * | 1/2014 | Kim et al. | 345/100 |
| 2007/0104307 A1 * | 5/2007 | Kim et al. | 377/64 |

* cited by examiner

*Primary Examiner* — Tuan T Lam
(74) *Attorney, Agent, or Firm* — Winston Hsu; Scott Margo

(57) ABSTRACT

A shift register for providing a plurality of gate signals includes an Nth stage shift register unit and an (N+1)th stage shift register unit. The Nth stage shift register unit includes a first pull up unit, a first driving unit, a first control unit and a first auxiliary pull down unit. The (N+1)th stage shift register unit includes a second pull up unit, a second driving unit, a first pull down unit and a second auxiliary pull down unit. The first and second pull up units are both coupled to the first and second driving units for controlling the first and second driving units to generate gate signals. The first and second auxiliary pull down units are both coupled to the first control unit for pulling down the gate signals.

19 Claims, 7 Drawing Sheets

SHIFT REGISTER

BACKGROUND OF THE INVENTION

1. Field of the Invention

The present invention relates to a shift register, especially a shift register having a plurality of stages of shift register units.

2. Description of the Prior Art

A Liquid crystal display (LCD) changes the arrangement of the liquid crystal molecules by changing the voltage difference between both ends of the liquid crystal layer, to change the transparency of the liquid crystal layer. The LCD displays images with the light source provided to provide the backlight of the LCD. In general, an LCD comprises a plurality of pixel units, a source driver and a gate driver. The source driver is used to provide a plurality of data signals to the plurality of pixel units. The gate driver comprises a plurality of shift register circuits to generate a plurality of gate signals to the pixel units, so as to control the writing operation of the data signals.

In order to reduce the thickness of the display, and to reduce the frame width of the display, efforts have been taken to try to reduce the size of the shift register circuitry of the display. However, the size of the shift register circuitry cannot be easily reduced because circuit stability has to be maintained, making it difficult to reduce the thickness and frame width of the display.

SUMMARY OF THE INVENTION

An embodiment of the present relates to a shift register for providing a plurality of gate signals. The shift register comprises an Nth stage shift register unit, an (N+1)th stage shift register unit, a first control unit and a first auxiliary pull down unit. The Nth stage shift register unit comprises a first pull up unit and a first driving unit. The first pull up unit has an output end for outputting a first driving control voltage. The first driving unit has a control end coupled to the output end of the first pull up unit, a first end for receiving a first clock signal, and a second end coupled to a first gate line, for generating a first gate signal according to the first driving control voltage and the first clock signal. The (N+1)th stage shift register unit comprises a second pull up unit, a second driving unit and a first pull down unit. The second pull up unit has an output end coupled to the output end of the first pull up unit. The second driving unit has a control end coupled to the output end of the second pull up unit, a first end for receiving a second clock signal, and a second end coupled to a second gate line, for generating a second gate signal according to the first driving control voltage and the second clock signal. The first pull down unit comprises a third switch and a fourth switch. The third switch has a first end coupled to the second end of the second driving unit, a control end for receiving a fourth gate signal, and a second end coupled to a common voltage end. The fourth switch has a first end coupled to the output end of the second pull up unit, a control end for receiving the fourth gate signal, and a second end coupled to the common voltage end. The first control unit is coupled to the common voltage end, having an input end for receiving a first system signal, and an output end for generating a first control signal. The first auxiliary pull down unit comprises a fifth switch and a sixth switch. The fifth switch has a first end coupled to the second gate line, a control end coupled to the output end of the first control unit, and a second end coupled to the common voltage end. The sixth switch has a first end coupled to the first gate line, a control end coupled to the output end of the first control unit, and a second end coupled to the common voltage end. N is a positive integer.

These and other objectives of the present invention will no doubt become obvious to those of ordinary skill in the art after reading the following detailed description of the preferred embodiment that is illustrated in the various figures and drawings.

DETAILED DESCRIPTION

Some phrases are referred to specific elements in the present specification and claims, please notice that the manufacturer might use different terms to refer to the same elements. However, the definition between elements is based on their functions instead of their names. Further, in the present specification and claims, the term "comprising" is open type and should not be viewed as the term "consisted of." Besides, the term "electrically coupled" can be referred to either directly connecting or indirectly connecting between elements.

The embodiments and figures are provided as follows in order to illustrate the present invention in detail, but please notice that the claimed scope of the present invention is not limited by the provided embodiments and figures.

Figure 1A:
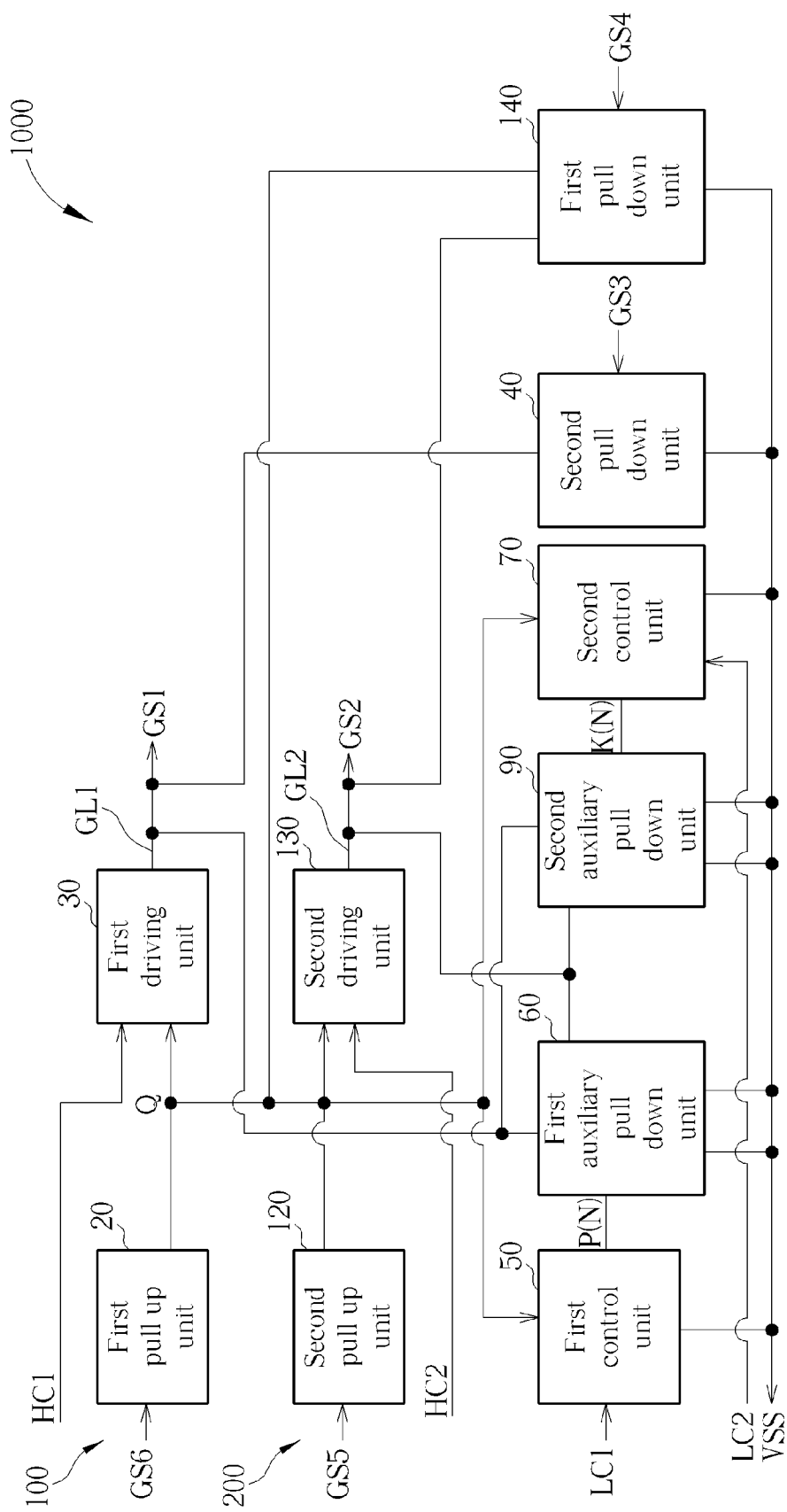
FIG. 1A shows a block diagram of a shift register according to a first embodiment of the present invention.
Figure 1B:
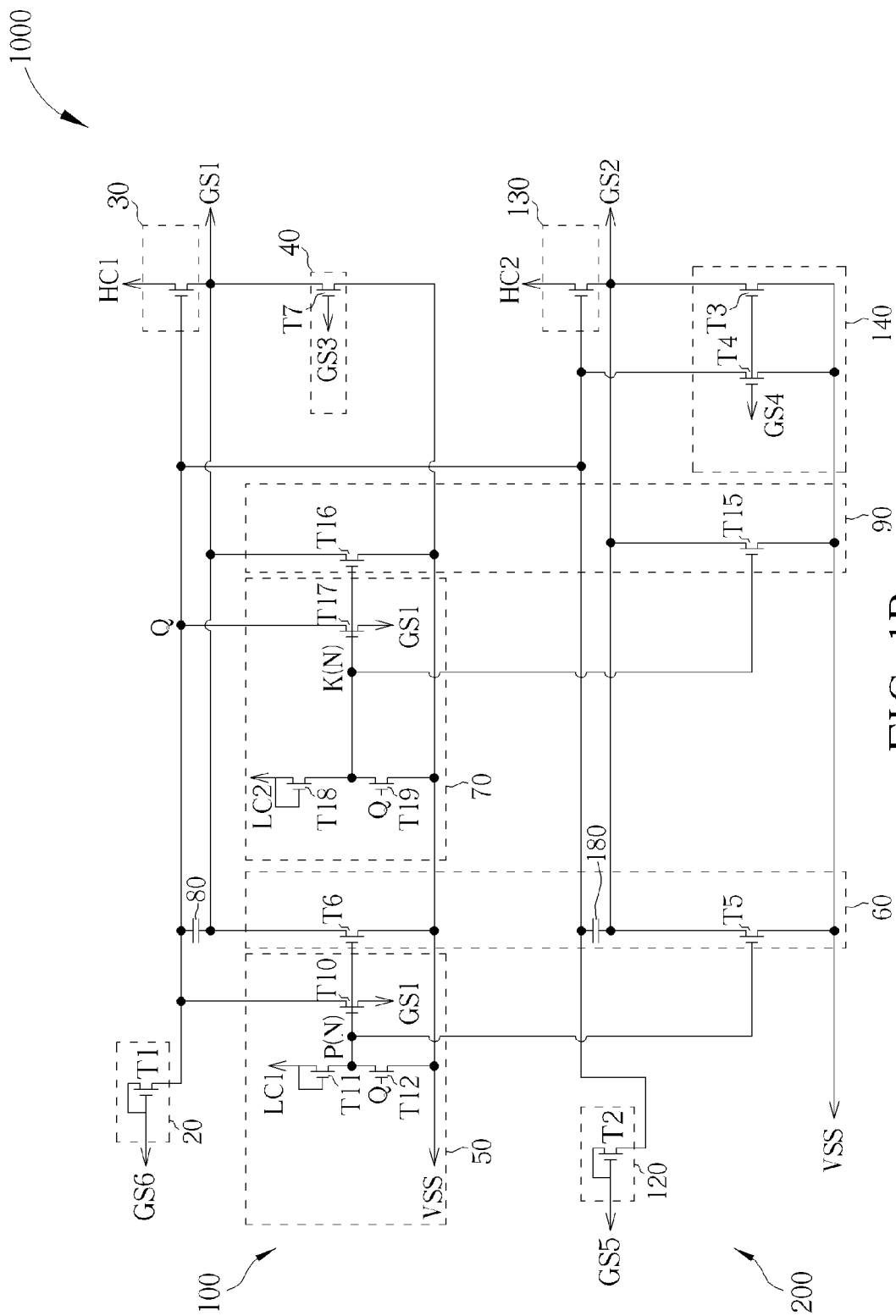
FIG. 1B shows the circuitry of the shift register according to a first embodiment of the present invention.

Please refer to FIGS. 1A and 1B. FIG. 1A shows a block diagram of a shift register 1000 according to a first embodiment of the present invention. FIG. 1B shows the circuitry of the shift register 1000 according to a first embodiment of the present invention. The shift register 1000 is used for providing a plurality of gate signals to a plurality of gate lines, and comprises a first stage shift register unit 100, a second stage shift register unit 200, a first control unit 50, a second control unit 70, a first auxiliary pull down unit 60 and a second auxiliary pull down unit 90.

The first stage shift register unit 100 comprises a first pull up unit 20 and a first driving unit 30. The first pull up unit 20 is used to output a first driving control voltage Q. The first driving unit 30 is coupled between the first pull up unit 20 and the first stage gate line GL1, and outputs the first gate signal GS1 according to the first clock signal HC1. The first shift register unit 100 can optionally comprise a second pull down unit 40 coupled to the common voltage end VSS for pulling down the level of the first driving unit 30.

The second stage shift register unit 200 comprises a second pull up unit 120, a second driving unit 130 and a first pull down unit 140. The second pull up unit 120 is coupled to the first pull up unit for extending the time for outputting the first driving control voltage Q. The second driving unit 130 is coupled between the second pull up unit 120 and the second gate line G12, and outputs the second gate signal GS2 according to the second clock signal HC2. The first pull down unit 140 is coupled to the common voltage end VSS and the output end of the first pull up unit 20 for pulling down the level of the second driving unit 130.

The first control unit 50 is coupled to the common voltage end VSS, and has an input end for receiving a first system signal LC1, and an output end for generating a first control signal P(N). The first auxiliary pull down unit 60 is coupled to the common voltage end VSS, the first gate line GL1, the second gate line GL2, and the output end of the first control unit 50. The first auxiliary pull down unit 60 is used to alternately pull down the levels of the first gate signal GS1 and the second gate signal GS2.

The second control unit 70 is coupled to the common voltage end VSS, and has an input end for receiving a second system signal LC2, and an output end for generating a second control signal K(N). The second auxiliary pull down unit 90 is coupled to the common voltage source VSS, the first gate line GL1, the second gate line GL2 and the output end of the second control unit 70. The second auxiliary pull down unit 90 is used to alternately pull down the levels of the first gate signal GS1 and the second gate signal GS2. The first system signal LC1 and the second system signal LC2 can be low frequency clock signals.

The shift register 1000 is used to provide a plurality of gate signals to a plurality of gate lines. The first pull up unit 20 comprises a first switch T1, having a control end, a first end, and a second end for outputting a first driving control voltage Q. The control end of the first switch T1 is coupled to the first end of the first switch T1, for receiving the sixth gate signal GS6. The first driving unit 30 has a control end coupled to the second end of the first switch T1, a first end for receiving the first clock signal HC1, and a second end coupled to the first gate line GL1. When the first driving unit 30 is turned on by the first driving control voltage Q, the first driving unit 30 is used to output the first clock signal HC1 to the first gate line GL1 to generate the first gate signal GS1. The second pull down unit 40 comprises a seventh switch T7 having a first end coupled to the second end of the first driving unit 30, a control end for receiving a third gate signal GS3, and a second end coupled to the common voltage end VSS. Through the configuration of the second pull down unit 40, the level of the second end of the first driving unit 30 can be pulled down quickly.

The second pull up unit 120 comprises a second switch T2 having a control end, a first end and a second end for outputting the first driving control voltage Q. The control end of the second switch T2 is coupled to the first end of the second switch T2 for receiving a fifth gate signal GS5. The second driving unit 130 has a control end coupled to the second end of the second switch T2, a first end for receiving the second clock signal HC2, and a second end coupled to the second gate line G12. The second driving unit 130 is used to output the second clock signal HC2 to the second gate line GL2 to generate a second gate signal GS2 when the second driving unit 130 is turned on by the first driving control voltage Q. The first pull down unit 140 comprises a third switch T3 and the fourth switch T4. The third switch T3 has a first end coupled to the second end of the second driving unit 130, a control end for receiving a fourth gate signal GS4, and a second end coupled to the common voltage end VSS. The fourth switch T4 has a first end coupled to the second end of the second switch T2, a control end for receiving the fourth gate signal GS4, and a second end coupled to the common voltage end VSS. Through the configuration of the first pull down unit 140, the levels of the control end and the second end of the second driving unit 130 can be pulled down quickly.

The first control unit 50 is coupled to the common voltage end VSS, and has an input end for receiving the first system signal LC1, and an output end for generating the first control signal P(N). The first auxiliary pull down unit 60 comprises a fifth switch T5 and a sixth switch T6. The fifth switch T5 has a first end coupled to the second gate line GL2, a control end coupled to the output end of the first control unit 50, and a second end coupled to the common voltage end VSS. The sixth switch T6 has a first end coupled to the first gate line GL1, a control end coupled to the output end of the first control unit 50, and a second end coupled to the common voltage end VSS. N is a positive integer.

The first control unit 50 comprises a tenth switch T10, an eleventh switch T11 and a twelfth switch T12. The tenth switch T10 has a first end coupled to the second end of the first switch T1, a control end coupled to the output end of the first control unit 50, and a second end coupled to the first gate line GL1. The eleventh switch T11 has a first end for receiving the first system signal LC1, a control end coupled to the first end of the eleventh switch T11, and a second end coupled to the control end of the tenth switch T10. The twelfth switch T12 has a first end coupled to the second end of the eleventh switch T11, a control end for receiving the first driving control voltage Q, and a second end coupled to the common voltage end VSS.

The second control unit 70 comprises a seventeenth switch T17, an eighteenth switch T18 and a nineteenth switch T19. The seventeenth switch T17 has a first end coupled to the second end of the first switch T1, a control end coupled to the output end of the second control unit 70, and a second end coupled to the first gate line GL1. The eighteenth switch T18 has a first end for receiving the second system signal LC2, a control end coupled to the first end of the eighteenth switch T18, and a second end coupled to the control end of the seventeenth switch T17. The nineteenth switch T19 has a first end coupled to the second end of the eighteenth switch T18, a control end for receiving the first driving control voltage Q, and a second end coupled to the common voltage end VSS. In this embodiment, the level of the common voltage end VSS can be low or negative, and is not limited to a specific level.

The first storage unit 80 has a first end coupled to the second end of the first switch T1, and a second end coupled to the first gate line GL1 for performing a charging or discharging procedure according to the first driving control voltage Q. The second storage unit 180 has a first end coupled to the second end of the second switch T2, and a second end coupled to the second gate line GL2 for performing a charging or discharging procedure according to the first driving control voltage Q. For example, when the level of the sixth gate signal GS6 or the level of the fifth gate signal GS5 is high, the first driving control voltage Q will be pulled to high and charge the first storage unit 80 or the second storage unit 180.

In the shift register 1000, the first driving control voltage Q and the first gate signal GS1 can be pulled down by alternatively controlling the first auxiliary pull down unit 60 with the first control unit 50 and controlling the second auxiliary pull down unit 90 with the second control unit 70. Thus, the first control unit 50 and the first auxiliary unit 60 will not be overloaded, the charge depositing effect can be reduced, and the voltage required to turn on the first control unit 50 and the first auxiliary unit 60 does not need to be increased.

In the first embodiment, the first gate signal GS1 can be an Nth stage gate signal. If the first gate signal GS1 is the Nth stage gate signal, then the second gate signal GS2 can be an (N+1)th stage gate signal, the third gate signal GS3 can be an (N+2)th stage gate signal, the fourth gate signal GS4 can be an (N+3)th stage gate signal, the fifth gate signal GS5 can be an (N−1)th stage gate signal, the sixth gate signal GS3 can be an (N−2)th stage gate signal, and the first driving control voltage Q can be an Nth stage diving control voltage.

Figure 1C:
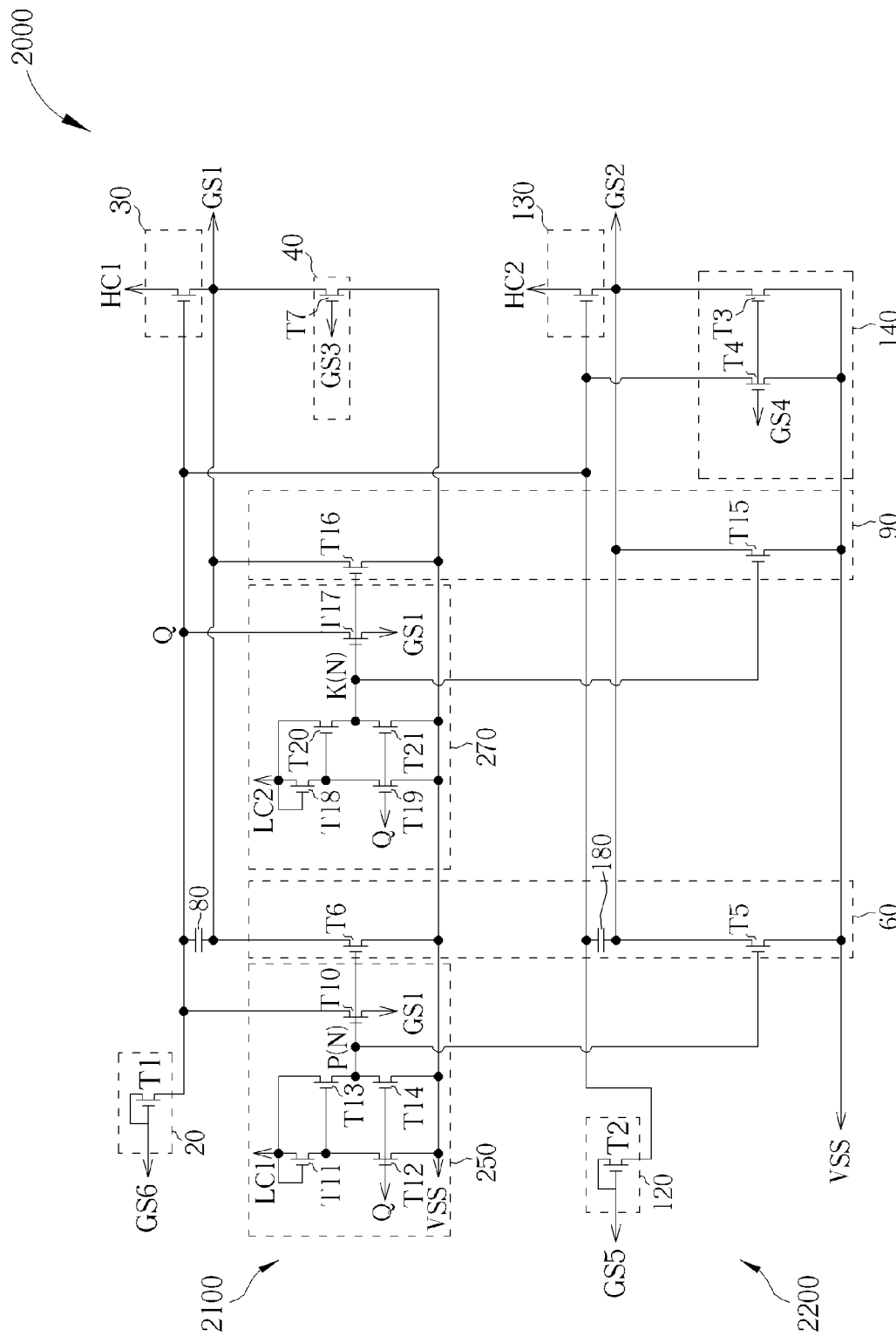
FIG. 1C shows the circuitry of the shift register according to a second embodiment of the present invention.

Pleases refer to FIG. 1C, which shows the circuitry of the shift register 2000 according to a second embodiment of the present invention. In FIG. 1C, the shift register 200 comprises a first stage shift register unit 2100 and a second stage shift register unit 2200. The difference between the shift registers 1000 and 2000 is that, in the first stage shift register unit 2100 of the second shift register 2000, the first control unit 250 comprises a tenth switch T10, an eleventh switch T11, a twelfth switch T12, a thirteenth switch T13 and a fourteenth switch T14. The tenth switch T10 has a first end coupled to the second end of the first switch T1, a control end coupled to the output end of the first control unit 250, and a second end coupled to the first gate line GL1. The eleventh switch T11 has a first end for receiving the first system signal LC1, a control end coupled to the first end of the eleventh switch T11, and a second end. The twelfth switch T12 has a first end coupled to the second end of the eleventh switch T11, a control end for receiving the first driving control voltage Q, and a second end coupled to the common voltage end VSS. The thirteen switch T13 has a first end coupled to the first end of the eleventh switch T11, a control end coupled to the second end of the eleventh switch T11, and a second end coupled to the control end of the tenth switch T10. The fourteenth T14 switch has a first end coupled to the second end of the thirteenth switch T13, a control end for receiving the first driving control voltage Q, and a second end coupled to the common voltage VSS.

The second control unit 270 comprises a seventeenth switch T17, an eighteenth switch T18, a nineteenth switch T19, a twentieth switch T20 and a twenty-first switch T21. The seventeenth switch T17 has a first end coupled to the second end of the first switch T1, a control end coupled to the output end of the second control unit 270, and a second end coupled to the first gate line GL1. The eighteenth switch T18 has a first end for receiving the second system signal LC2, a control end coupled to the first end of the eighteenth switch T18, and a second end. The nineteenth switch T19 has a first end coupled to the second end of the eighteenth switch T18, a control end for receiving the first driving control voltage Q, and a second end coupled to the common voltage end VSS; The twentieth switch T20 has a first end coupled to the first end of the eighteenth switch T18, a control end coupled to the second end of the eighteenth switch T18, and a second end coupled to the control end of the seventeenth switch T17. The twenty-first switch T21 has a first end coupled to the second end of the twentieth switch T20, a control end coupled to the control end of the nineteenth switch T19, and a second end coupled to the common voltage end VSS.

In the second embodiment, the first gate signal GS1 can be an Nth stage gate signal. If the first gate signal GS1 is an Nth stage gate signal, then the second gate signal GS2 can be an (N+1)th stage gate signal, the third gate signal GS3 can be an (N+2)th stage gate signal, the fourth gate signal GS4 can be an (N+3)th stage gate signal, the fifth gate signal GS5 can be an (N−1)th stage gate signal, the sixth gate signal GS3 can be an (N−2)th stage gate signal, and the first driving control voltage Q can be an Nth stage diving control voltage.

In the first and second embodiments, the control end of the fifth switch T5 is coupled to the control end of the tenth switch T10, and the control end of the fifteenth switch T15 is coupled to the control end of the seventeenth switch T17. Thus, the first stage shift register unit 100, 2100 can share the first driving control voltage Q, the first control signal P (N) and the second control signal K(N) with the second stage shift register unit 200, 2200. In the elements of each stage shift register unit, e.g. the first control unit 50, 250 and the second control unit 70, 270, the switches are relatively large. Through the configuration that the first stage shift register unit 100, 2100 shares the first control unit 50, 250 and the second control unit 70, 270 with the second stage shift register unit 200, 2200, the area of the shift register 1000, 2000 can be reduced by almost half. Therefore, the total areas of the shift registers 1000 and 2000 can be greatly reduced.

Besides, in the first and second embodiments, the second end of the second switch T2 of the second stage shift register unit 200, 2200 is coupled to the second end of the first switch T1 of the first stage shift register unit 100, 2100 so as to share the first driving control voltage Q with the first stage shift register unit 100, 2100. Thus, the time of the first driving control voltage Q being kept at a high level will be extended. This allows the second pull down unit 40 and the first pull down unit 140 to have sufficient time to release the charges stored in the first driving unit 30 and the second driving unit 130, to more effectively perform the pull down function. Further, the second end of the second switch T2 of the second stage shift register unit 200, 2200 is coupled to the second end of the first switch T1 of the first stage shift register unit 100, 2100 to share the first driving control voltage Q, thus extending the time of the first driving control voltage Q being kept at a high level, such that the first driving unit 30 has sufficient time to release charges. In this way, the second pull down unit 40 can be removed from the first stage shift register unit 100, 2100 to reduce the total area of the shifter register 1000, 2000.

Figure 1D:
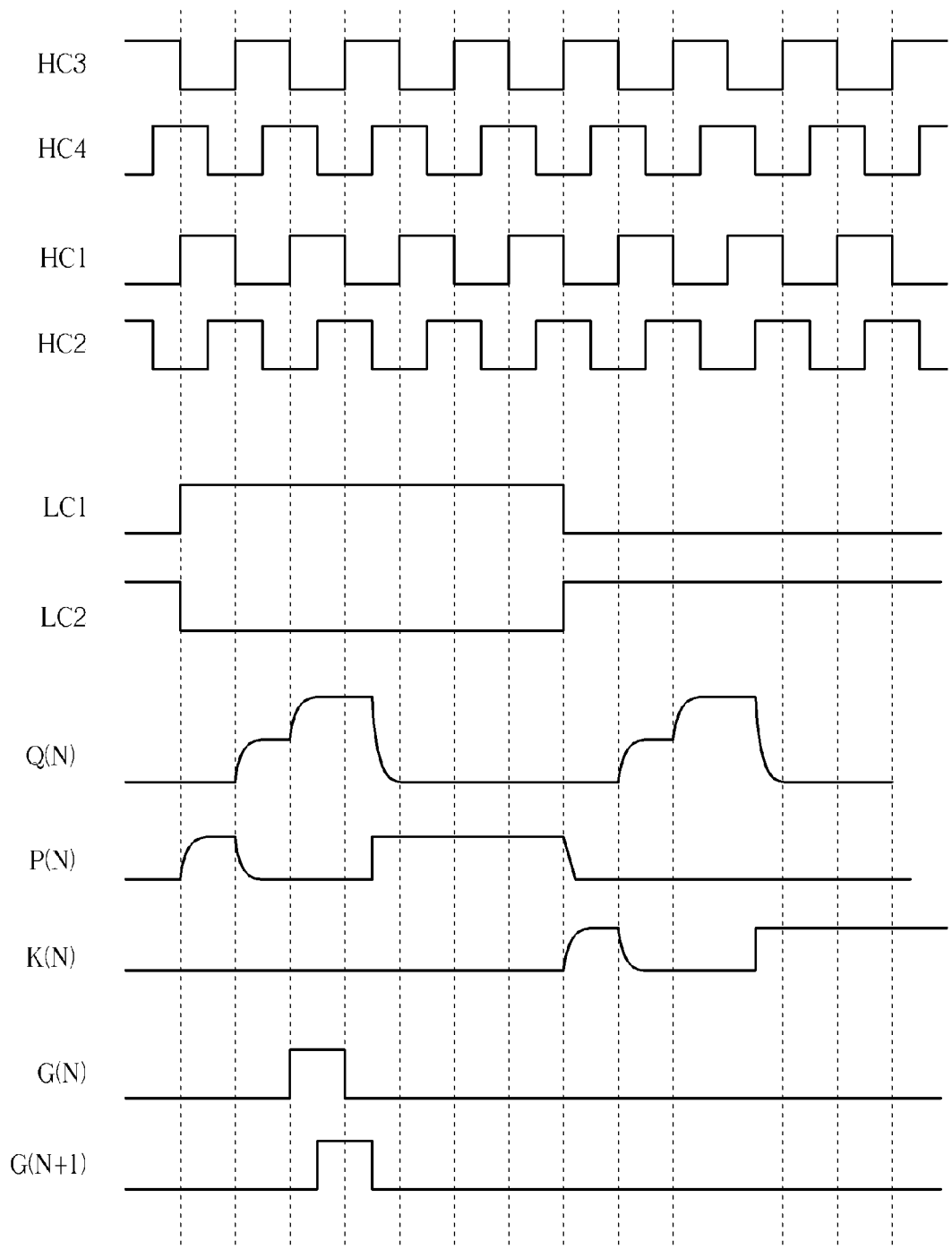
FIG. 1D shows a timing diagram of the shift registers in FIGS. 1B and 1C.

Please refer to FIG. 1D, which shows a timing diagram of the shift registers 1000, 2000 in FIGS. 1B and 1C. As shown in FIG. 1D, when the level of the first system signal LC1 is high and the level of the first driving control voltage Q is low, the twelfth switch T12 will be turned off and the eleventh switch T11 will be turned on. Therefore, the level of the first control signal P(N) at the second end of the thirteenth switch T13 will be high, thus turning on the fifth switch T5 and the sixth switch T6 in the first auxiliary pull down unit 60. In this way, turning off of the first driving unit 30 can be accelerated through the first driving control voltage Q being pulled down by the common voltage end VSS.

When the first driving control voltage Q is raised to a high level, the twelfth switch T12 will be turned on, thus pulling the first control signal P(N) to the low level of the common voltage end VSS. In this way, the fifth switch T5 and the sixth switch T6 in the first auxiliary pull down unit 60 can be turned off to prevent the common voltage end VSS from pulling down the first driving control voltage Q through the fifth switch T5 and the sixth switch T6, and to ensure that the first gate line GL1 can receive correct waveforms. Besides, because the second system signal LC2 and the first system signal LC1 are logically inversed, when the level of the first system signal LC1 changes from high to low, and the level of the second system signal LC2 changes from low to high, the level of the second control signal K(N) will change from low to high, and the level of the first control signal P(N) will change from high to low.

When the level of the second system signal LC2 is high and the level of the first driving control voltage Q is low, the nineteenth switch T19 will be turned off and the eighteenth switch T18 will be turned on. In this way, the level of the second control signal K(N) at the second end of the twentieth switch T20 will be high, thus turning on the fifteenth switch T15 and the sixteenth switch T16 in the second auxiliary pull down unit 90, such that turning off of the first driving unit 30 can be accelerated through the first driving control voltage Q being pulled down by the common voltage end VSS. When the level of the first driving control voltage Q is raised to high, the nineteenth switch T19 will be turned on. In this way, the second control signal K(N) will be pulled to the low level of the common voltage end VSS, to turn off the fifteenth switch T15 and the sixteenth switch T16 in the second auxiliary pull down unit 90 to prevent the common voltage end VSS from pulling down the first driving control voltage Q through the fifteenth switch T15 and the sixteenth switch T16. It can further ensure that the first gate line GL1 can receive correct waveforms.

Figure 2:
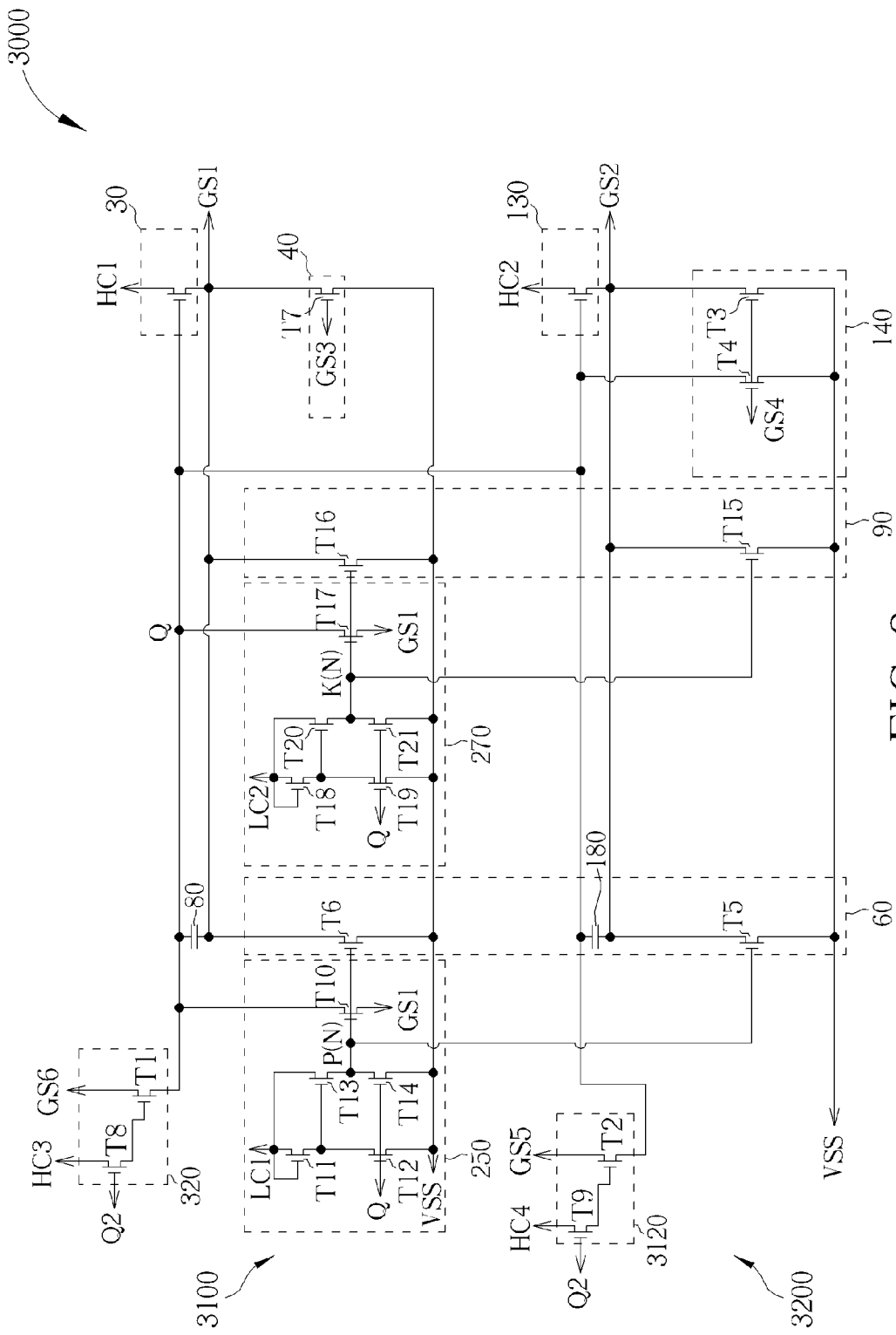
FIG. 2 shows the circuitry of the shift register according to a third embodiment of the present invention.

Please refer to FIG. 2, which shows the circuitry of the shift register 3000 according to a third embodiment of the present invention. As shown in FIG. 2, the shift register 3000 comprises a first stage shift register unit 3100 and a second stage shift register unit 3200. The difference between the shift registers 3000 and 2000 is that, in the first stage shift register unit 3100 of the second shift register 3000, the first pull up unit 320 further comprises an eighth switch T8. The eighth switch T8 has a control end for receiving a second driving control voltage Q2, a first end for receiving a third clock signal HC3, and a second end coupled to the control end of the first switch T1. The first end of the first switch T1 is used to receive the sixth gate signal GS6. The first switch T1 is turned on or off according to the level of the second end of the eighth switch T8. That is, the eighth switch T8 is used to control the first switch T1 to receive the sixth gate signal GS6 or not.

In the second stage shift register unit 3200 of the shift register 3000, the second pull up unit 3120 further comprises a ninth switch T9. The ninth switch T9 has a control end for receiving the second driving control voltage Q2, a first end for receiving a fourth clock signal HC4, and a second end coupled to the control end of the second switch T2. The second switch T2 is turned on or off according to the level of the second end of the ninth switch T9. That is, the ninth switch T9 is used to control the second switch T2 to receive the fifth gate signal GS5 or not.

Please refer to FIG. 1D again, as shown in FIG. 1D, when the level of the first system signal LC1 is high and the level of the first driving control voltage Q is low, the twelfth switch T12 will be turned off and the eleventh switch T11 will be turned on. Therefore, the level of the first control signal P(N) at the second end of the thirteenth switch T13 will be high, thus turning on the fifth switch T5 and the sixth switch T6 in the first auxiliary pull down unit 60. In this way, turning off of the first driving unit 30 can be accelerated through the first driving control voltage Q being pulled down by the common voltage end VSS.

In the third embodiment of the present invention, the first gate signal GS1 can be an Nth gate signal, the second gate signal GS2 can be an (N+1)th stage gate signal, the third gate signal GS3 can be an (N+(K−1))th stage gate signal, the fourth gate signal GS4 can be an (N+K)th stage gate signal, the fifth gate signal GS5 can be an (N−(K−3))th stage gate signal, the sixth gate signal GS3 can bean (N−(K−2))th stage gate signal, the first driving control voltage Q can be an Nth stage diving control voltage, and the second driving control voltage Q2 can be an (N−2)th stage diving control voltage. K is a natural number not smaller than 2.

In the third embodiment, the control end of the fifth switch T5 is coupled to the control end of the tenth switch T10, and the control end of the fifteenth switch T15 is coupled to the control end of the seventeenth switch T17. Thus, the first stage shift register unit 3100 can share the first driving control voltage Q, the first control signal P(N) and the second control signal K(N) with the second stage shift register unit 3200. In the elements of each stage shift register unit, e.g. the first control unit 250, the second control unit 270, the areas of control units and switches are relatively large. Through the configuration that the first stage shift register unit 3100 shares the first control unit 250 and the second control unit 270 with the second stage shift register unit 3200, the area in the shift register 3000 can be reduced by almost half. Therefore, the total area of the shift register 3000 can be greatly reduced.

Besides, in the third embodiment, the second end of the second switch T2 of the second stage shift register unit 3200 is coupled to the second end of the first switch T1 of the first stage shift register unit 3100, so as to share the first driving control voltage Q with the first stage shift register unit 3100. Thus, the time of the first driving control voltage Q being kept at a high level can be extended. This allows the second pull down unit 40 and the first pull down unit 140 to have sufficient time to release the charges stored in the first driving unit 30 and the second driving unit 130, to more effectively perform the pull down function. Further, the second end of the second switch T2 of the second stage shift register 3200 is coupled to the second end of the first switch T1 of the first stage shift register unit 3100 to share the first driving control voltage Q, thus extending the time of the first driving control voltage Q being kept at a high level, providing the first driving unit 30 sufficient time to release charges. In this way, the second pull down unit 40 can be removed from the first shift register unit 3100 to reduce the total area of the shifter register 3000.

Figure 3A:
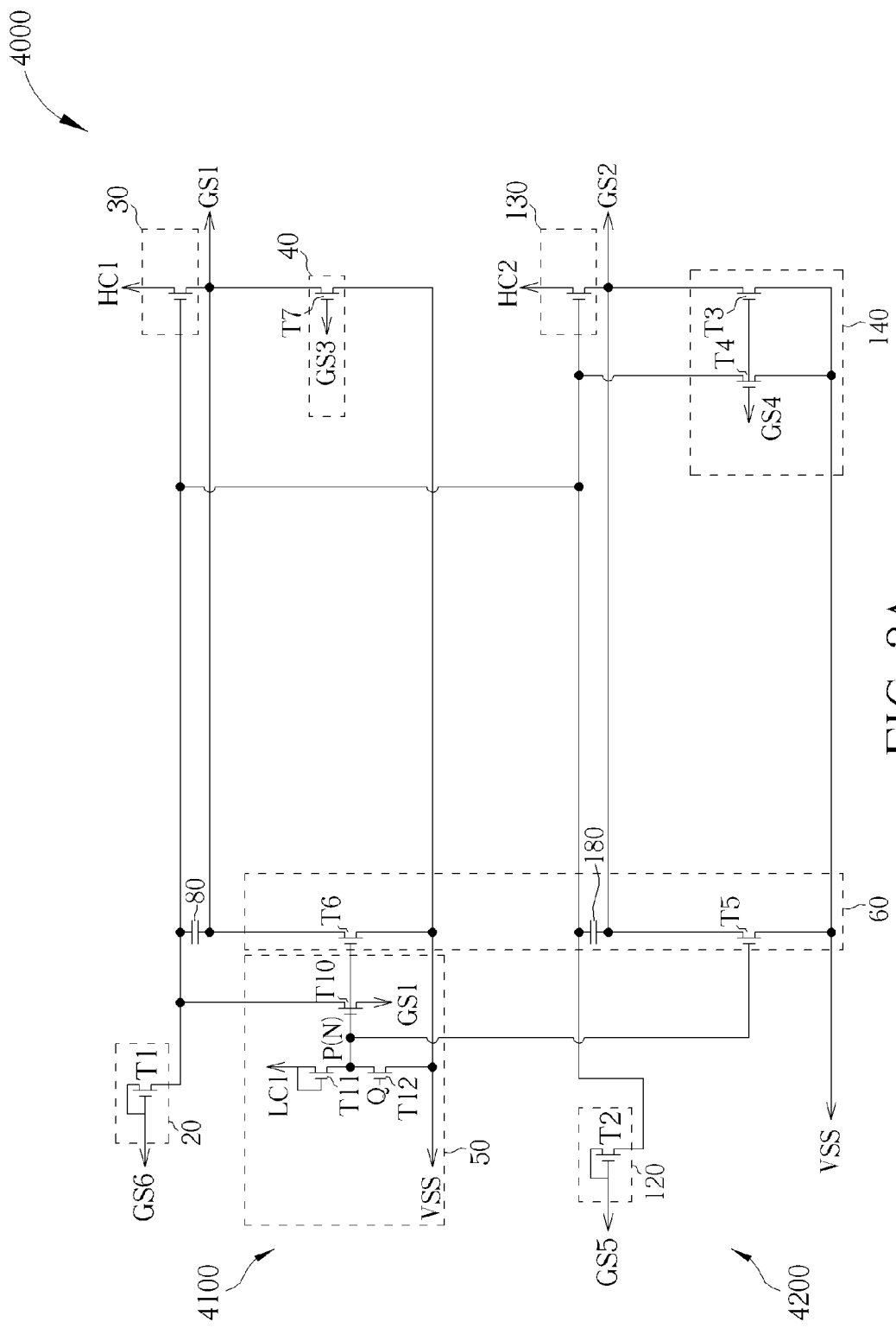
FIG. 3A shows the circuitry of the shift register according to a fourth embodiment of the present invention.

Please refer to FIG. 3A, which shows the circuitry of the shift register 4000 according to a fourth embodiment of the present invention. As shown in FIG. 3A, the shift register 4000 comprises a first stage shift register unit 4100 and a second stage shift register unit 4200. The difference between the shift registers 4000 and 1000 is that, the shift register 4000 does not comprise the second control unit 70 and the second auxiliary pull down unit 90. Through the configuration of the fourth embodiment, the total volume of the shift register circuit in the display can be further reduced. Thus, the display can be designed to be slimmer.

Figure 3B:
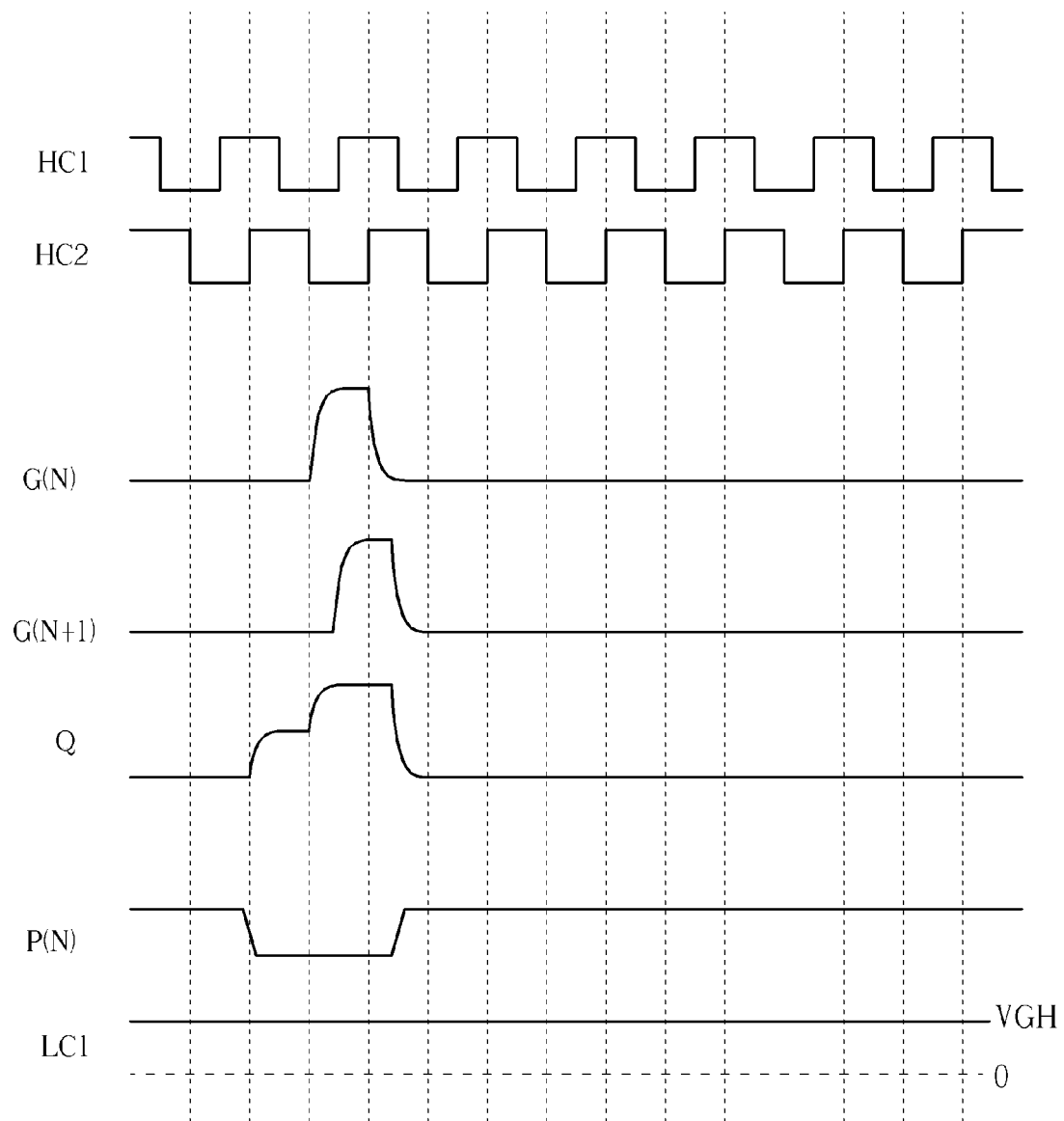
FIG. 3B shows a timing diagram of the shift register in FIG. 3A.

Please refer to FIG. 3B, which shows a timing diagram of the shift register 4000 in FIG. 3A. As shown in FIGS. 3A and 3B, since the first stage shift register unit 4100 is configured to comprise only one control unit, the first control unit 50, the first system signal LC1 is provided with the gate high voltage VGH, which is a fixed high level voltage, e.g. 30 volts. When the first driving control voltage Q is low, the twelfth switch T12 will be turned off and the eleventh switch T11 will be turned on. Therefore, the level of the first control signal P(N) at the second end of the eleventh switch T11 will be high, thus turning on the fifth switch T5 and the sixth switch T6 in the first auxiliary pull down unit 60. In this way, turning off of the first driving unit 30 can be accelerated through the first driving control voltage Q being pulled down by the common voltage end VSS.

When the first control voltage Q is raised to a high level, the twelfth switch T12 will be turned on, thus pulling the first control signal P(N) to the low level of the common voltage end VSS. In this way, the fifth switch T5 and the sixth switch T6 in the first control unit 50 are turned off to prevent the common voltage end VSS from pulling down the first driving control voltage Q through the fifth switch T5 and the sixth switch T6, and to ensure that the first gate line GL1 can receive correct waveforms.

In the aforementioned embodiments, by coupling the second end of the second switch T2 in the second stage shift register unit 200, 2200, 3200, 4200 to the second end of the first switches T1 in the first stage shift register units 100, 2100, 3100, 4100, and coupling the control end of the fifth switch T5 to the control end of the tenth switch T10 in the shift register 1000, 2000, 3000, 4000, the first stage shift register unit 100, 2100, 3100, 4100 shares the first driving control voltage Q and the first control signal P(N) with the second stage shift register units 200, 2200, 3200, 4200. This will reduce the area of the shift register 1000, 2000, 3000, 4000 without affecting the operation stability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register for providing a plurality of gate signals, comprising:
    an Nth stage shift register unit, comprising:
        a first pull up unit, having an output end for outputting a first driving control voltage; and
        a first driving unit, having a control end coupled to the output end of the first pull up unit, a first end for receiving a first clock signal, and a second end coupled to a first gate line, for generating a first gate signal according to the first driving control voltage and the first clock signal;
    an (N+1)th stage shift register unit, comprising:
        a second pull up unit, having an output end coupled to the output end of the first pull up unit;
        a second driving unit, having a control end coupled to the output end of the second pull up unit, a first end for receiving a second clock signal, and a second end coupled to a second gate line, for generating a second gate signal according to the first driving control voltage and the second clock signal; and
        a first pull down unit, comprising:
            a third switch, having a first end coupled to the second end of the second driving unit, a control end for receiving a fourth gate signal, and a second end coupled to a common voltage end; and
            a fourth switch, having a first end coupled to the output end of the second pull up unit, a control end for receiving the fourth gate signal, and a second end coupled to the common voltage end;
    a first control unit, coupled to the common voltage end, having an input end for receiving a first system signal, and an output end for generating a first control signal; and
    a first auxiliary pull down unit, comprising:
        a fifth switch, having a first end coupled to the second gate line, a control end coupled to the output end of the first control unit, and a second end coupled to the common voltage end; and
        a sixth switch, having a first end coupled to the first gate line, a control end coupled to the output end of the first control unit, and a second end coupled to the common voltage end;
    wherein N is a positive integer.

2. The shift register of claim 1, wherein the first pull up unit comprises a first switch having a control end for receiving a sixth gate signal, a first end coupled to the control end of the first switch, and a second end coupled to the control end of the first driving unit.

3. The shift register of claim 2, wherein the second pull up unit comprises a second switch having a control end for receiving a fifth gate signal, a first end coupled to the control end of the second switch, and a second end coupled to the control end of the second driving unit.

4. The shift register of claim 3, wherein the Nth stage shift register unit further comprises a second pull down unit for receiving a gate signal generated by an (N+2)th stage shift register unit.

5. The shift register of claim 4, wherein the second pull down unit comprises:
    a seventh switch having a first end coupled to the second end of the first driving unit, a control end for receiving a third gate signal, and a second end coupled to the common voltage end.

6. The shift register of claim 5, wherein the third gate signal is a gate signal generated by an (N+(K−1))th stage shift register unit, wherein K≥2.

7. The shift register of claim 1, wherein the first pull up unit comprises:
    a first switch having a first end for receiving a sixth gate signal, a second end coupled to the control end of the first driving unit, and a control end; and
    an eighth switch having a control end for receiving a second driving control voltage, a first end for receiving a third clock signal, and a second end coupled to the control end of the first switch.

8. The shift register of claim 7, wherein the second pull up unit comprises:
    a second switch having a first end for receiving a fifth gate signal, a second end coupled to the control end of the second driving unit, and a control end; and
    a ninth switch having a control end for receiving the second driving control voltage, a first end for receiving a fourth clock signal, and a second end coupled to the control end of the second switch.

9. The shift register of claim 8, wherein the sixth gate signal is generated by an (N−(K−2))th stage shift register unit, and the second driving control voltage is a driving control voltage generated by an (N−2)th stage shift register unit, wherein K≥2.

10. The shift register of claim 1, wherein the first control unit comprises:
    a tenth switch having a first end coupled to the output end of the first pull up unit, a control end coupled to the output end of the first control unit, and a second end coupled to the first gate line;
    an eleventh switch having a first end for receiving the first system signal, a control end coupled to the first end of the eleventh switch, and a second end coupled to the control end of the tenth switch; and
    a twelfth switch having a first end coupled to the second end of the eleventh switch, a control end for receiving the first driving control voltage, and a second end coupled to the common voltage end.

11. The shift register of claim 10, wherein the first system signal is a gate high voltage.

12. The shift register of claim 1, wherein the first control unit comprises:
    a tenth switch having a first end coupled to the output end of the first pull up unit, a control end coupled to the output end of the first control unit, and a second end coupled to the first gate line;
    an eleventh switch having a first end for receiving the first system signal, a control end coupled to the first end of the eleventh switch, and a second end;
    a twelfth switch having a first end coupled to the second end of the eleventh switch, a control end for receiving the first driving control voltage, and a second end coupled to the common voltage end;
    a thirteen switch having a first end coupled to the first end of the eleventh switch, a control end coupled to the second end of the eleventh switch, and a second end coupled to the control end of the tenth switch; and a fourteenth switch having a first end coupled to the second end of the thirteenth switch, a control end for receiving the first driving control voltage, and a second end coupled to the common voltage.

13. The shift register of claim 12, wherein the first system signal is a gate high voltage.

14. The shift register of claim 1, further comprising:

a second control unit coupled to the common voltage end, the second control unit having an input end for receiving a second system signal, and an output end for generating a second control signal; and a second auxiliary pull down unit comprising:
   a fifteenth switch having a first end coupled to the second gate line, a control end coupled to the output end of the second control unit, and a second end coupled to the common voltage end; and
   a sixteenth switch having a first end coupled to the first gate line, a control end coupled to the output end of the second control unit, and a second end coupled to the common voltage end.

15. The shift register of claim 14, wherein the first system signal is a first low frequency clock signal, and the second system signal is a second low frequency clock signal.

16. The shift register of claim 14, wherein the second control unit comprises:

a seventeenth switch having a first end coupled to the output end of the first pull up unit, a control end coupled to the output end of the second control unit, and a second end coupled to the first gate signal;

an eighteenth switch having a first end for receiving the second system signal, a control end coupled to the first end of the eighteenth switch, and a second end coupled to the control end of the seventeenth switch; and a nineteenth switch having a first end coupled to the second end of the eighteenth switch, a control end for receiving the first driving control voltage, and a second end coupled to the common voltage end.

17. The shift register of claim 14, wherein the second control unit further comprises:

a seventeenth switch having a first end coupled to the output end of the first pull up unit, a control end coupled to the output end of the second control unit, and a second end coupled to the first gate signal;

an eighteenth switch having a first end for receiving the second system signal, a control end coupled to the first end of the eighteenth switch, and a second end;

a nineteenth switch having a first end coupled to the second end of the eighteenth switch, a control end for receiving the first driving control voltage, and a second end coupled to the common voltage end;

a twentieth switch having a first end coupled to the first end of the eighteenth switch, a control end coupled to the second end of the eighteenth switch, and a second end coupled to the control end of the seventeenth switch; and a twenty-first switch having a first end coupled to the second end of the twentieth switch, a control end coupled to the control end of the nineteenth switch, and a second end coupled to the common voltage end.

18. The shift register of claim 1, wherein the Nth stage shift register unit further comprises a first storage unit having a first end coupled to the control end of the first driving unit, and a second end coupled to the first gate line.

19. The shift register of claim 1, wherein the (N+1)th stage shift register unit further comprises a second storage unit having a first end coupled to the control end of the first driving unit, and a second end coupled to the second gate line.

* * * * *